Oct. 29, 1968 MINORU ONO ETAL 3,408,543

COMBINATION CAPACITOR AND FIELD-EFFECT TRANSISTOR

Filed June 1, 1965

2 Sheets-Sheet 1

INVENTORS

MINORU ONO

KOJI USUDA

BY Paul M. Craig, Jr.

ATTORNEY

Oct. 29, 1968 MINORU ONO ETAL 3,408,543

COMBINATION CAPACITOR AND FIELD-EFFECT TRANSISTOR

Filed June 1, 1965

2 Sheets-Sheet 2

INVENTORS
MINORU ONO
KOJI USUDA

BY Paul M. Craig, Jr.
ATTORNEY

United States Patent Office 3,408,543

Patented Oct. 29, 1968

3,408,543

COMBINATION CAPACITOR AND FIELD-EFFECT TRANSISTOR

Minoru Ono and Koji Usuda, Kodaira-shi, Japan, assignors to Hitachi, Ltd., Tokyo, Japan Filed June 1, 1965, Ser. No. 460,270
Claims priority, application Japan, June 1, 1964, 39/42,803
10 Claims. (Cl. 317—235)

ABSTRACT OF THE DISCLOSURE

A semiconductor integrated circuit comprising a MOS FET portion and a MOS diode portion. The MOS FET portion comprises a P-type silicon substrate, N-type source and drain diffused regions formed in a main surface of said silicon substrate, a carrier path formed in the semiconductor surface layer between the regions, a first insulating layer disposed on the carrier path, and metal electrodes formed on the source and drain regions, and the insulating layer. The MOS diode portion comprises the drain region, a second insulating layer disposed on the drain region, and a metal layer formed on the second insulating layer. As examples, the integrated circuit is employed in an amplifier circuit and an oscillator circuit.

The present invention relates to semiconductor devices, and more particularly to semiconductor integrated circuitry.

The primary object of the present invention is to provide a novel monolithic semiconductor device having a so-called MOS field effect transistor (hereinafter referred to as MOS FET) and a MOS diode or diodes built therein.

As described in U.S. Patent No. 2,744,970 a field effect transistor which is, as a circuit element, comparable with a vacumm tube has a drain corresponding to an anode or a plate of the tube, a source corresponding to a cathode, and a gate corresponding to a grid, the current carriers flowing through a channel between the source and the drain being controlled by the gate. A MOS FET or an insulated gate FET is disclosed in U.S. Patent No. 3,102,230. In such a device the channel current can be controlled only by voltage only with little necessity of control power on account of the very high input impedance $10^{14}\sim10^{15}\Omega$ of the gate thereof. Such voltage control and resulting high input impedance are made possible since the carriers flowing the channel are field controlled by the voltage applied to gate electrodes holding an insulator such as $SiO_2$ layer therebetween.

According to the present invention a semiconductor device is provided which comprises a MOS FET portion composed of a substrate of a first conductivity type semiconductor, a source and a drain region of a second conductivity type semiconductor formed in said substrate and spaced apart from each other, and a gate electrode conductor formed on an insulating layer covering the inner surface of said substrate and bridging said source region and said drain region. The device further comprises a MOS diode portion composed of at least said source region or said drain region and a conductor disposed thereabove holding an insulating layer therebetween. The resulting semiconductor device is capable of being utilized in an oscillator circuit, an amplifier circuit or the like as described later.

The above mentioned source or drain region of the second conductivity type may be formed in the first conductivity type semiconductor substrate by means of the selective diffusion method disclosed in U.S. Patent No. 2,802,760. As the insulating layer constructing the MOS structure, a silicon dioxide ($SiO_2$) film may be preferable. However, other materials such as a kind of oxide of germanium, oxide of aluminum, or the like are also suitable.

Silicon dioxide coating is formed by means of either one of the following methods. One method is to oxidize the surface of the silicon semiconductor substrate. This is accomplished by exposing the silicon substrate to a water vapor or a wet oxygen atmosphere and heating at 1000°–1200° C. Another method is the thermal decomposition of organo-oxy-silane. In this method by flowing, for instance, tetra-ethoxy-silane mixed in nitrogen carrier gas around a body to be coated and holding at 700°–750° C., the tetra-ethoxy-silane decomposes and $SiO_2$ is deposited on the surface of the body. This method is not limited to the silicon substrate only, and is therefore suitable for germanium and intermetallic compound semiconductor substrates. By means of still another method, oxide can be formed on the semiconductor surface by anodic oxidation.

Although silicon, germanium or inter-metallic compound semiconductor can be used as a semiconductor substrate, silicon is preferable because of its capability of obtaining stable oxide films with ease and the comparatively high operation temperature range in which it can be used. However, other materials can be used selectively according to circumstances.

The structure of the semiconductor device according to the present invention and the application thereof will be better understood from the following description taken in conjunction with the accompanying drawings, in which.

Figure 4:
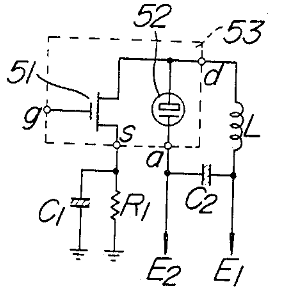
Figure 5:
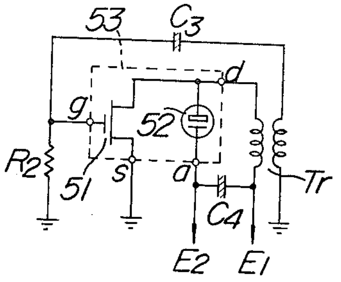
Figure 7:
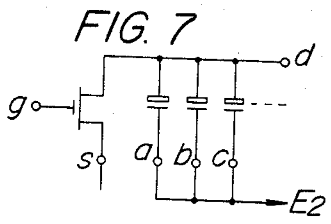
Figure 8:
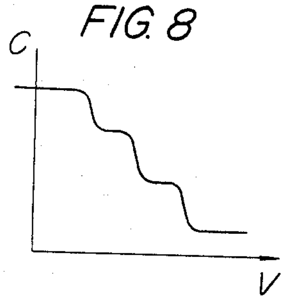

FIGS. 3(*b*) to 3(*d*) show fabrication process of the device of FIG. 3(*a*);

FIGS. 4 and 5 are examples of electronic circuit using a device of the invention;

FIG. 6 is diagrams of the characteristics of MOS diodes;

FIG. 7 is a circuit diagram of another application of a device of the invention; and FIG. 8 is a diagram representing the characteristics of the circuit of FIG. 7.

Figures 1A, 1B, 2A, 2B:
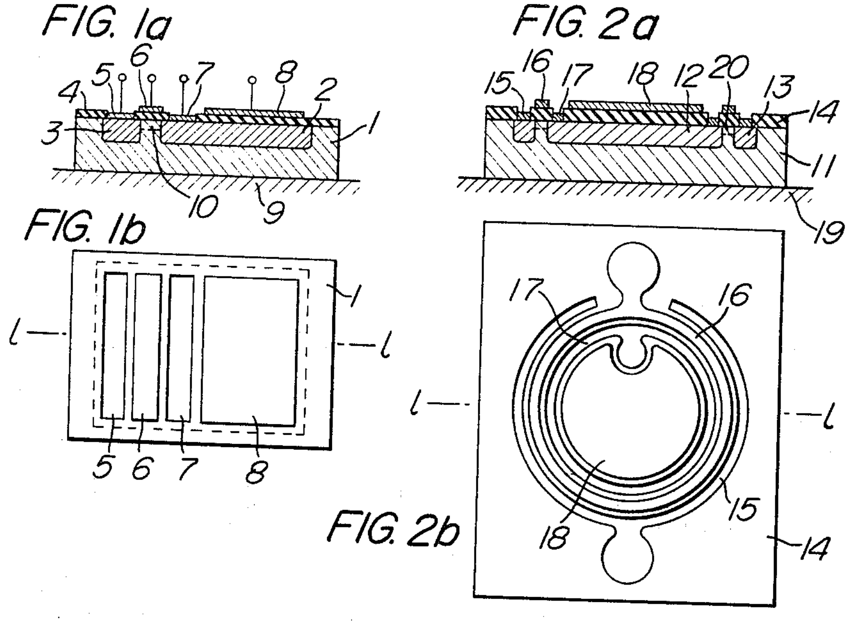
FIG. 1 shows the fundamental structure of a semiconductor device according to the present invention wherein (a) is a sectional view and (b) is a plan view.
FIG. 2 is another embodiment of the invention wherein (a) is a sectional view and (b) is a plan view.

Now describing with reference to FIG. 1, reference numeral 1 represents a semiconductor substrate of a first conductivity type, 2 a drain region of the second conductivity type, 3 a source region of the second conductivity type, 4 an insulating film covering the upper surface of the substrate, 5, 6, 7 and 8 a source electrode, a gate electrode, a drain electrode and an electrode constituting one terminal of a MOS diode, respectively. The MOS diode may also be constructed by forming the electrode conductor 8 above the source region. Reference numeral 9 represents a support, and 10 represents a channel connecting the source region and the drain region. The space dimension between the source region and the drain region, i.e. the length of the channel is typically of the order of 10$\mu$. Incidentally, it is also possible to use 2 as a source region and 3 as a drain region.

By the way of the description, the conductivity type of the substrate is taken as P-type. At first a P-type silicon single crystal wafer having a resistivity of 1~ 10Ω cm. is prepared and polished to mirror surface, and then held for two hours in a water vapor atmosphere at 1000° C., resulting in the formation of an $SiO_2$ layer on the surface thereof, after which openings reaching the surface of Si are made in the $SiO_2$ layer by the well known photo-etching technique in order to form the source region and the drain region. Through the openings the diffusion process of an N-type impurity is effected. When as an example phosphorus is utilized as the N-type impurity, the device is held at 1100° C. for five minutes in a $PCl_3$ atmosphere.

By this treatment the phosphorus is selectively introduced into the Si substrate through the opening formed in the $SiO_2$. Then by means of a heat treatment in oxygen atmosphere the phosphorus introduced into the Si subtrate is further deeply diffused, while, at the same time, a $SiO_2$ layer is formed again at the opening. In this manner the N-type regions 2 and 3 are formed. Lastly in the $SiO_2$ layer 4 are formed openings extending to the source 3 and the drain 2 where the source electrode conductor 5 and the drain electrode conductor 7 are formed. Similarly the conductors 6 and 8 are formed on the $SiO_2$ layer. As the conductors, for instance an Al layer deposited by means of a known vacuum evaporation method may be utilized. The resulting device is soldered to the support 9. In this embodiment an N-type thin layer induced on the surface of the semiconductor by the $SiO_2$ layer is utilized as the channel 10.

Generally $SiO_2$ has a property that makes the semiconductor surface portion covered thereby N-type, and therefore the surface portion of a P-type semiconductor substrate is converted into N-type when the impurity concentration thereof is low. Such a structure is generally called depletion mode. On the other hand, when the substrate is of N-type, the surface portion contacting with the $SiO_2$ layer is converted into a high impurity concentration $n^+$ region, which case is called enhancement mode. In the case of the depletion mode, since the current path or the channel connecting the source and the drain has already been formed, a current flows through the channel even when the bias voltage applied to the gate electrode is zero, whereas in the case of the enhancement mode, since the surface portion of the semiconductor has a higher impurity concentration than the interior portion of the N-type substrate, it is necessary to apply a definite bias voltage to the gate electrode in order to convert the semiconductor surface portion into P-type which cancels the $n^+$ conducting type and form the channel connecting the source and the drain.

FIG. 2 illustrates an embodiment having a large current capacity, in which a drain region is surrounded by an annular source region. In the figure numeral 11 designates a first conductivity type semiconductor substrate, 12 a second conductivity type drain region, 13 a source region of the second conductivity type, 14 an insulating film such as $SiO_2$, 15 a source electrode, 16 a gate electrode formed on an insulating film bridging the source 13 and the drain 12, 17 a drain electrode, 18 an electrode layer constituting with the drain region a MOS diode, 19 a support, and 20 a channel between the source 13 and the drain 12 through which currents flow.

Examples of electronic circuits utilizing the devices according to the invention are shown in FIGS. 4 and 5. FIG. 4 illustrates the application thereof to an amplifier circuit. The part surrounded by a broken line 53 indicates a MOS FET 51 and MOS diode 52 integrated into a monolithic structure. A tuning circuit is constituted by the MOS diode and an outside inductance L connected through an electrostatic capacity $C_2$ between terminals Ⓐ and Ⓑ. FIG. 5 illustrates the application to an oscillator circuit. A MOS FET 51 and MOS diode 52 surrounded by a broken line 53 is the device according to the invention. The output from a terminal Ⓓ is fed back to a terminal Ⓖ through a transformer Tr and a capacitor $C_3$.

It is generally known that when a bias voltage is applied between the metal electrode and the semiconductor substrate of a MOS diode, the electrostatic capacity thereof varies in accordance with the voltage.

Figure 6A:
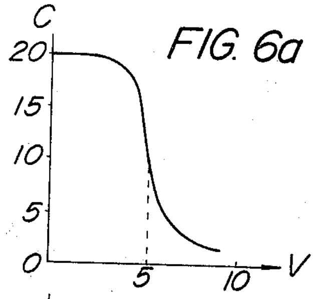
Figure 6B:
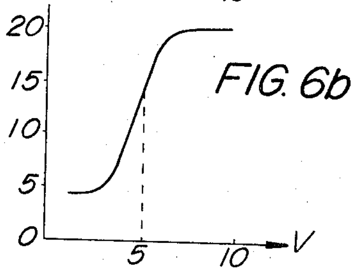

Representative characteristics thereof are shown in FIG. 6 wherein the abscissa is the voltage (volt) applied between the metallic electrode and the semiconductor substrate, and the ordinate is the electrostatic capacity (pF). FIG. 6(a) is for a substrate of N-type silicon and FIG. 6(b) is for a substrate of P-type silicon. Measurement frequency is 1 mc.

By utilizing the property that the capacity varies depending upon the voltage the tuning frequency or the oscillation frequency in the example of FIG. 4 or 5, respectively, can be controlled by varying the bias voltage $E_2$. That the ratio $C_{max}/C_{min}$ of the maximum capacity $C_{max}$ to the minimum capacity $C_{min}$ varies in accordance with the thickness of the $SiO_2$ film or the frequency is described in Bell System Technical Journal, vol. XLI, No. 3, May 1962, pp. 803–831. The value of $C_{max}$ or $C_{min}$ which is determined by the area of the conductive layer formed on the $SiO_2$ or by the thickness of the $SiO_2$ layer can be arbitrarily designed as the case requires. Since the value of $C_{max}/C_{min}$ depends also upon the impurity concentration in the semi-conductor substrate, and the higher the impurity concentration is, the smaller is the variation rate thereof, the structure shown in FIG. 3 is preferred when the device having a large variation rate is desired.

Figures 3A, 3B, 3C, 3D:
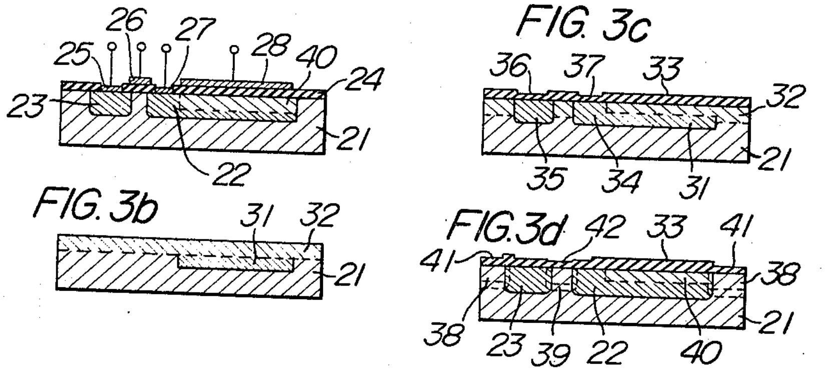
FIG. 3(*a*) is a sectional view of still another embodiment of the invention.

In FIG. 3(a) numeral 21 designates for instance a P-type Si substrate having a high resistivity, and 23 designates an N-type source region. 22 is an N-type high impurity region ($N^+$) acting as a drain region to which is connected contiguously an N-type low impurity region ($N^-$) 40. 24 designates a $SiO_2$ layer formed on a semiconductor surface, 25 a source electrode, 26 a gate electrode, and 27 a drain electrode. An electrode layer 28 is formed on the $SiO_2$ covering the high resistivity ($N^-$) region 40, and constitutes a MOS diode with the region 40. The low resistivity ($N^+$) region 22 lying under the $N^-$ region 40 plays the role of reducing the spread resistance at the region 40 of the MOS diode.

Such a semiconductor structure is fabricated by the following method. A high resistivity P-type silicon substrate having a surface polished to mirror surface as shown in FIG. 3(b) is prepared and a low resistivity $N^+$ region 31 is formed therein by a well-known selective diffusion technique, after which an $N^-$ type silicon layer 31 is grown thereon epitaxially from the vapour phase by a well-known epitaxial method. Then, as shown in FIG. 3(c), a $SiO_2$ layer 33 is formed on the epitaxially grown layer 32, and $N^+$ regions 34 and 35 are formed by selectively heavily doping an N-type impurity by utilizing the $SiO_2$ layer as a mask. The region 34 is contacting with the region 31. While the N-type impurity is diffusing, $SiO_2$ layers 36 and 37 are formed within the openings formed in the $SiO_2$ layer 33. The $N^+$ region 35 and the $N^+$ regions 34 and 31 are electrically isolated by P-type regions 38 and 39 formed by selectively diffusing a P-type impurity through the $SiO_2$ mask as shown in FIG. 3(d), and at the same time the region 40 contiguous to the $N^+$ region 34 is formed. Then $SiO_2$ layers 41 and 42 filling the openings formed in the $SiO_2$ layer are produced. Lastly, openings extending to the regions 34 and 35 are formed in the $SiO_2$ layer where the electrode layers 25 and 27 are produced, while, at the same time, the electrode layers 26 and 28 are provided on the $SiO_2$ layer.

As disclosed by the inventors in Ser. No. 372,350, "Method of Producing Semiconductor Devices," the voltage at which the capacity starts to vary can be optionally controlled by a heat treatment at approximately 300° C. of a MOS diode which is kept applied the voltage between the metal electrode and the semiconductor substrate thereof.

The application of the method of the above treatment to a monolithic device constituted by a MOS FET and a plurality of MOS diodes as shown in the circuit diagram of FIG. 7 provides a device the capacity of which varies stepwise as shown in FIG. 8. For example, after the voltage at which the capacities start to vary is made diversified by a heat treatment of the device which is kept in the state that respectively different bias voltages are applied to the terminals Ⓐ, Ⓑ, Ⓒ, . . . , and Ⓓ thereof, each MOS diode is connected in parallel by connecting the terminals Ⓐ, Ⓑ, Ⓒ, . . . commonly. If the bias voltage $E_2$ applied to the common terminal is varied, the capacity of each MOS diode varies in sequence, and the capacity of the device seen from the terminal Ⓓ and the common terminal varies stepwise as shown in FIG. 8. Such a device is useful when tuning frequency or oscillation frequency is desired to vary discontinuously.

The above-described device according to the present invention is small in size, has small number of wire connections, has high reliability, is suitable for mass production, and has wide application.

Although in the above embodiments silicon is used as a semiconductor material, germanium or intermetallic compound semiconductors are also usable. Further, instead of a P-type semiconductor substrate an N-type semiconductor substrate can also be used. As a conductivity type determining impurity well-known impurity materials are capable of being suitably selected without departing from the scope of and modifying the concept of the invention. Although some embodiments according to the present invention have been described in conjunction with several drawings, the invention is obviously applicable to other structures also than those shown in the drawings.

What is claimed is:

1. A semiconductor device comprising:
a semiconductor substrate of a first conductivity type;
two regions of a second conductivity type formed in said substrate, said two regions extending from one surface of said substrate into the body thereof and being disposed adjacently and oppositely to each other;
a first conductor disposed on an insulating layer arranged on a surface portion of said substrate, said surface portion lying between said two adjacent and opposite regions; and
at least one second conductor covering a surface portion of at least one of said regions and holding an insulating layer therebetween.

2. A semiconductor device comprising:
a semiconductor substrate of a first conductivity type;
a source region and a drain region consisting of a semiconductor region of a second conductivity type formed in said substrate, said two regions extending from one surface of said substrate into the body thereof and being disposed adjacently and oppositely to each other;
a gate electrode layer disposed on an insulating layer arranged on a surface portion of said substrate, said surface portion lying between said source region and said drain region; and
at least one electrode conductor covering a surface portion of said drain region and holding an insulating layer therebetween.

3. A semiconductor device comprising:
a semiconductor substrate of a first conductivity type;
a drain region consisting of a semiconductor region of a second conductivity type formed in said substrate and extending from a surface of said substrate into the body thereof;
a source region consisting of a semiconductor region of the second conductivity type surrounding said drain region and extending from said surface of said substrate into said body thereof;
a gate electrode layer disposed intermediate said drain and source regions and surrounding said drain region on an insulating layer which is provided on a surface portion of said substrate existing between said source region and said drain region; and
at least one electrode conductor covering a surface portion of said drain region and holding an insulating layer therebetween.

4. A semiconductor device according to claim 1, characterized in that said region lying under said second conductor has a low impurity concentration at a surface portion contacting said insulating layer and a low resistivity in an inside portion thereof.

5. A semiconductor device according to claim 1, characterized in that by controlling a bias voltage applied between said second conductor and said region arranged thereunder an electro-static capacity between said second conductive layer and said region is controlled.

6. A semiconductor device comprising; a semiconductor substrate having a plane surface; an active circuit element formed in said substrate, said element including a plurality of semiconductive regions provided adjacent said plane surface of said substrate, each of said regions extending to said plane surface and being of different conductivity type from adjoining semiconductor material and forming PN junctions between said regions extending wholly to said plane surface; at least one capacitor provided adjacent said plane surface, said capacitor including one of said regions, an insulating layer covering said one of said regions and a conductive layer adhered to the surface of said insulating layer; and a plurality of electrode means connected to said regions.

7. A semiconductor device comprising; a semiconductor substrate of one conductivity type having a plane surface; an insulated gate type field effect transistor including a pair of regions of opposite conductivity type disposed in said plane surface spaced from each other, one of said regions having a larger area than that of another, a gate electrode covering a surface portion between said pair of regions, and an insulating layer interposed between said gate electrode and said plane surface; at least one capacitor element including said region having a larger area, a conducting layer covering said region having a larger area and an insulating layer interposed therebetween; and a plurality of electrode means connected to said pair of regions.

8. A semiconductor device according to claim 7, in which an inductive element is connected to said capacitor element in parallel.

9. A method of producing a semiconductor device employing a semiconductor substrate of first conductivity type having a major surface, said method comprising forming a pair of semiconductor regions of second conductivity type in said major surface, forming an insulating film covering said major surface; forming two holes respectively in the insulating film on said semiconductor regions; and forming conductive electrode means spaced from each other and contacting said semiconductor regions through said holes,, on said insulating film covering the major surface between said semiconductor regions, and on the insulating film covering at least one of said semiconductor regions.

10. A method of producing a semiconductor device employing a semiconductor substrate of one conductivity type having a major surface comprising the steps of; preparing the major surface of the semiconductor substrate; forming an insulating film covering said major surface and having at least a pair of first openings; diffusing a conductivity type determining impurity into said substrate through said first openings to form diffused regions of opposite conductivity type in said major surface; forming insulating films on the surface of said diffused regions; forming second openings respectively in at least part of said insulating films covering the surface of said diffused regions; and forming first and second conductive means respectively on the surface of said diffused semiconductor regions through said second openings, third conductive means on said insulating film covering the major surface extending between said diffused regions, and fourth conductive means on the insulating film covering at least one of said semiconductor regions.

References Cited

UNITED STATES PATENTS

| | | | |
|---|---|---|---|
| 3,097,308 | 7/1963 | Wallmark | 317—235.9 |
| 3,102,230 | 8/1963 | Kahng | 317—235.21 |
| 3,115,581 | 12/1963 | Kilby | 317—235.22 |
| 3,134,912 | 5/1964 | Evans | 317—234.22 |
| 3,229,218 | 1/1966 | Sickles | 317—235-21.13 |
| 3,243,669 | 1/1966 | Sah | 317—235-21.16 |

JAMES D. KALLAM, *Primary Examiner.*